(12) United States Patent
Sekido et al.

(10) Patent No.: US 7,679,196 B2
(45) Date of Patent: Mar. 16, 2010

(54) STACKED MOUNTING STRUCTURE

(75) Inventors: Takanori Sekido, Chofu (JP); You Kondoh, Yamato (JP)

(73) Assignee: Olympus Corporation, Tokyo (JP)

( * ) Notice: Subject to any disclaimer, the term of this patent is extended or adjusted under 35 U.S.C. 154(b) by 506 days.

(21) Appl. No.: 11/639,045

(22) Filed: Dec. 14, 2006

(65) Prior Publication Data
US 2007/0164444 A1    Jul. 19, 2007

(30) Foreign Application Priority Data
Dec. 22, 2005   (JP) .............................. 2005-370157

(51) Int. Cl.
*H01L 29/41* (2006.01)
*H05K 7/02* (2006.01)
(52) U.S. Cl. ............... 257/773; 257/774; 257/E23.174; 257/E23.175; 361/742
(58) Field of Classification Search ................. 257/773, 257/774, E23.174, E23.175
See application file for complete search history.

(56) References Cited
U.S. PATENT DOCUMENTS
2004/0238948 A1* 12/2004 Shiozawa et al. ........... 257/723
2005/0029650 A1* 2/2005 Wood et al. .................. 257/698

FOREIGN PATENT DOCUMENTS
JP   4-38417   6/1992
JP   11-111914   4/1999

* cited by examiner

*Primary Examiner*—Evan Pert
(74) *Attorney, Agent, or Firm*—Scully, Scott, Murphy & Presser, P.C.

(57) ABSTRACT

A stacked mounting structure includes at least two substrates namely a first substrate on which a first protruding electrode is formed and a second substrate on which a second protruding electrode is formed, and an intermediate substrate which is disposed between the first substrate and the second substrate, and which connects the first substrate and the second substrate by leaving a predetermined gap between the first substrate and the second substrate. Mounted components are disposed in the gap between the first substrate and the second substrate. The first protruding electrode and the second protruding electrode are connected in an opening which is provided in the intermediate substrate.

17 Claims, 16 Drawing Sheets

STACKED MOUNTING STRUCTURE

CROSS-REFERENCE TO RELATED APPLICATION

The present application is based upon and claims the benefit of priority from the prior Japanese Patent Application No. 2005-370157 filed on Dec. 22, 2005; the entire contents of which are incorporated herein by reference.

BACKGROUND OF THE INVENTION

1. Field of the Invention

The present invention relates to a stacked mounting structure, and particularly to a three-dimensional stacked mounting structure which is made by stacking a plurality of members in a directions of thickness of the members.

2. Description of the Related Art

For a structure which includes substrates on which electronic components are mounted, various structures have been hitherto proposed (refer to Japanese Patent Application Kokoku (Post Exam Application) No. Hei 4-38417 and Japanese Patent Application Laid-open Publication No. Hei 11-111914 for example). In Japanese Patent Application Kokoku (Post Exam Application) No. Hei 4-38417, a mounting structure related to an imaging unit which is provided at a front end portion of an endoscope 10 as shown in FIG. 15, is disclosed. Here, a technology of stacking a mount substrate in parallel with an imaging device 11 is described. In this technology, first of all, a mount board 12 is disposed in parallel with the imaging device 11. Next, the mount board 12 on which the imaging device 11 is mounted, and a mount board 13 on which components other than the imaging device 11 are mounted, are mounted via a spacer. Accordingly, it is possible to dispose the components mounted on the mount boards, in a space equivalent to a height of the spacer, which is developed. Consequently, it is possible to improve a packaging density of the stacked mounting structure. As a result, it is possible to reduce a size of the imaging unit which is provided at the front end of the endoscope.

Moreover, in Japanese Patent Application Laid-open Publication No. Hei 11-111914, a structure of a stacked mounting structure 20 which includes a memory module substrate 24, as shown in FIG. 16 is disclosed. An inner side of a substrate 21 which is facing is hollow. A plurality of electrodes is provided on both sides of the substrate 21. Moreover, the electrodes on a front surface of the substrate 21 and the electrodes on a rear surface of the substrate 21, which is facing, are connected electrically. At a portion connecting the electrodes, an anisotropic electroconductive film 22 is adhered to both sides of an electroconductive spacer 25. Thus, in Japanese Patent Application Laid-open Publication No. Hei 11-111914, a structure of the substrate 21 on which an electronic component 23 is mounted, is disclosed. In this structure, for joining the electroconductive spacer 25 and the anisotropic electroconductive film 22, an electrode is provided in a (on a) through hole which is provided in the electroconductive spacer 25.

In the structure disclosed in Japanese Patent Application Kokoku (Post Exam Application) No. Hei 4-38417, an electric conduction between the substrates which are disposed by stacking, is ensured by a lead wire 14. An automation of a job of joining the substrates by the lead wire 14 is difficult. For example, a job of disposing and soldering short lead wires on a minute structure which is disposed three-dimensionally, is impossible to deal with in an automatic packaging machine. Therefore, the job of installing the lead wire 14 is to be carried out manually. Moreover, even with the job carried out manually, such mounting is categorized to be having a high degree of difficulty. A technology in which the automation is difficult, and the degree of difficulty of the job is high, leads to an increase in a mounting cost and a decline in productivity. Moreover, taking into consideration a size of the lead wire which can be handled in a manual job and a gap between the lead wires which can be controlled during the handling, a structure according to the conventional technology is not favorable for reducing a size of the mounting structure.

Moreover, in the structure disclosed in Japanese Patent Application Laid-open Publication No. Hei 11-111914, as it is evident in FIG. 16, an electrode having an area more than an outer diameter of the through hole is required to be provided on the electroconductive spacer 25. Therefore, it is difficult to narrow a pitch of a joining portion. In other words, it is difficult to reduce a projected area when the structure is viewed from a top. Furthermore, in this structure, the anisotropic electroconductive film 22 is used as a material for joining the electroconductive spacer 25 and the substrate 21. Therefore, there is a drawback that a resistance of the connecting portion between the electroconductive spacer 25 and the substrate 21 becomes high.

Thus, in the conventional mounting structure, it is difficult to ensure a favorable productivity for stacking a substrate via the spacer in order to ensure a mounting space of the electronic components. Moreover, it is also difficult to reduce the size such that a projected area in a direction of a plane of the substrate is decreased.

SUMMARY OF THE INVENTION

The present invention is made upon taking into consideration the problems mentioned above, and an object of the present invention is to provide a stacked mounting structure in which a plurality of substrates is connected via spacers, and components to be mounted are mounted in a space between the substrates, while reducing a size by decreasing a projected area in a direction of a plane of the substrate, and a method of manufacturing the stacked mounting structure in which, an improvement in a yield, a reduction in a cost, and a shortening of a manufacturing time are realized by decreasing number of steps in a manufacturing process.

In order to solve the abovementioned problems and to achieve the object, according to the present invention, it is possible to provide a stacked mounting structure which includes at least two members namely a first member on a surface of which a first protruding electrode is formed, and a second member, on a surface facing the first member of which, a second protruding electrode is formed, and an intermediate member which is installed between the first member and the second member, and which connects the first member and the second member by leaving a predetermined gap between the first member and the second member. Mounted components are disposed in a gap between the first member and the second member. The first protruding electrode and the second protruding electrode are connected in an opening which is provided in the intermediate member.

According to a preferable aspect of the present invention, it is desirable that a combined height of the first protruding electrode and the second protruding electrode which are facing mutually is more than a height of the intermediate member, and a shape of the first protruding electrode and a shape of the second protruding electrode are such that a front end portion of each of the first protruding electrode and the second protruding electrode is tapered to be the narrowest.

Moreover, according to another preferable aspect of the present invention, it is desirable that each of a maximum diameter of the first protruding electrode and a maximum diameter of the second protruding electrode is smaller than a diameter of the opening which is provided in the intermediate member.

Furthermore, according to still another preferable aspect of the present invention, it is desirable that the first protruding electrode and the second protruding electrode are formed by stacking in stages a plurality of protruding electrodes having a ratio of a width and a height 1:1.

According to still another preferable aspect of the present invention, it is desirable that the inner wall of the opening has a shape with concavities and convexities.

According to still another preferable aspect of the present invention, it is desirable that a chamfer is formed at an angular portion of an inner wall of the opening.

According to still another preferable aspect of the present invention, it is desirable that a material of the first protruding electrode and the second protruding electrode is Au.

According to still another preferable aspect of the present invention, it is desirable that an electroconductive layer is provided on a surface of the inner wall of the opening of the intermediate member.

According to still another preferable aspect of the present invention, it is desirable that a material of the first protruding electrode and the second protruding electrode is a solder.

According to still another preferable aspect of the present invention, it is possible to provide a method of manufacturing stacked mounting structure which includes steps of facing at which, at least two members namely a first member on a surface of which a first protruding electrode is formed and a second member, on a surface of facing the first member of which, a second protruding electrode is formed, are arranged to face mutually, disposing, at which an intermediate member is disposed between the first member and the second member, joining at which, the first member and the second member are joined via the intermediate member having a predetermined gap between the first member and the second member, such that the first protruding electrode and the second protruding electrode are joined in an opening which is provided in the intermediate member.

At the step of facing, a combined height of the first protruding electrode and the second protruding electrode which are facing mutually is let to be more than a height of the intermediate member, and a shape of the first protruding electrode and a shape of the second protruding electrode are let to be such that a front end portion of each of the first protruding electrode and the second protruding electrode is tapered to be the narrowest.

Furthermore, according to still another preferable aspect of the present invention, it is desirable that at the step of facing, each of a maximum diameter of the first protruding electrode and a maximum diameter of the second protruding electrode is let to be smaller than a diameter of the opening which is provided in the intermediate member.

BRIEF DESCRIPTION OF THE DRAWINGS

FIG. 12A, FIG. 12B, and FIG. 12C are diagrams showing cross-sectional views of a stacked mounting structure according to an eighth embodiment;

DETAILED DESCRIPTIONS

Embodiments of a stacked mounting structure according to the present invention will be described below in detail with reference to the accompanying diagrams. However, the present invention is not restricted to the embodiments which will be described below.

First Embodiment

Figure 1:
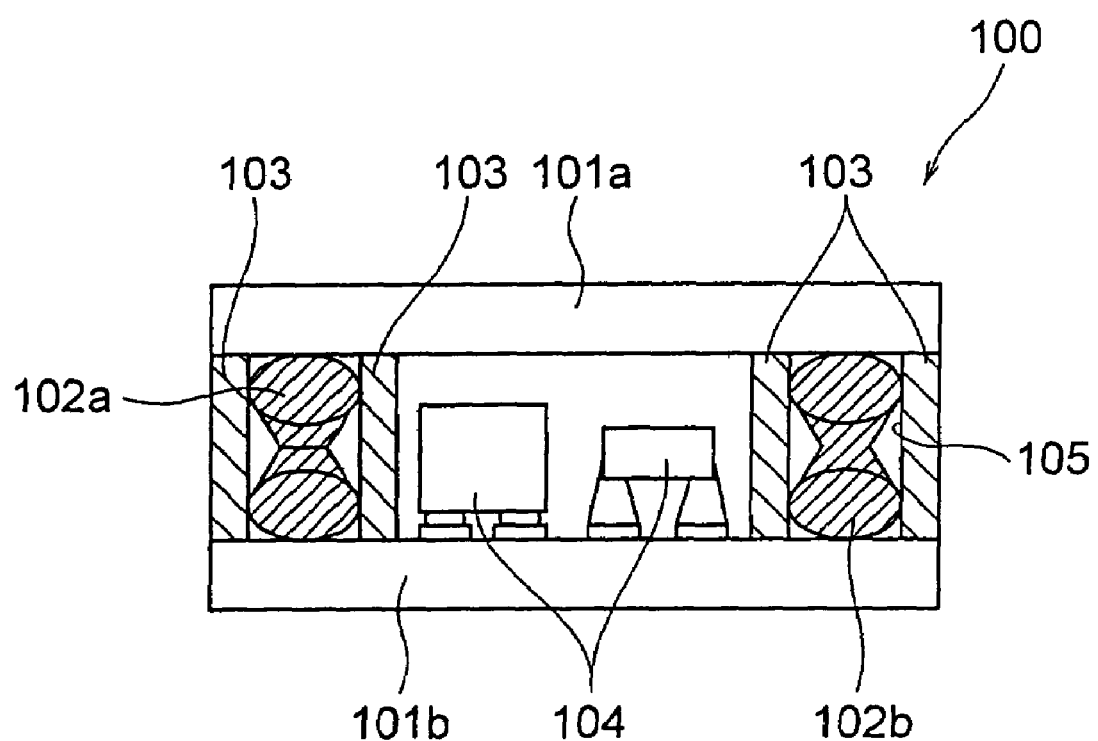
FIG. 1 is a diagram showing a cross-sectional view of a stacked mounting structure according to a first embodiment of the present invention.
Figure 2:
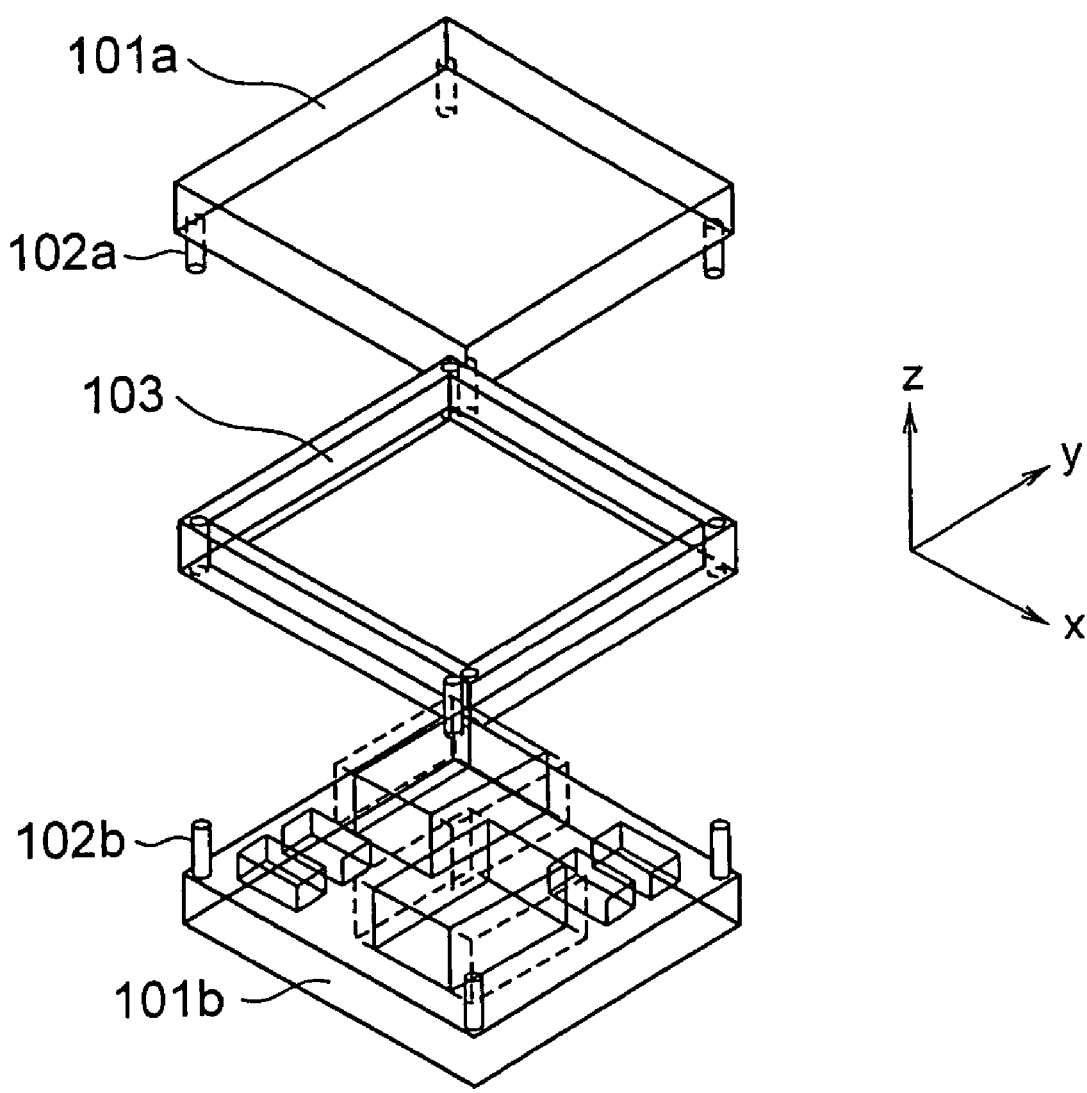
FIG. 2 is a diagram showing a perspective view of the disassembled stacked mounting structure of the first embodiment.

A stacked mounting structure 100 according to a first embodiment of the present invention will be described below. FIG. 1 shows a cross-sectional view of the stacked mounting structure 100. FIG. 2 shows a perspective view of the disassembled stacked mounting structure 100.

In FIG. 1, each of a first substrate 101a and a second substrate 101b is in a flat plate form. A substrate such as an organic substrate, a ceramic substrate, a glass substrate, a Si substrate, a metal substrate, and a flexible substrate can be used for these two substrates 101a and 101b. Moreover, it is also possible to use a composite material substrate in which these substrates are combined. The first substrate 101a corresponds to a first member. The second substrate 101b corresponds to a second member.

A term substrate is used for the sake of convenience. However, without restricting to the substrate, the present invention is similarly applicable to any member which forms a mounting structure and which is flat, such as a silicon chip and a package component.

A first protruding electrode 102a is formed on the first substrate 101a. Moreover, a second protruding electrode 102b is formed on the second substrate 101b. The first protruding electrode 102a and the second protruding electrode 102b are formed by a method such as a stud bumping, a plating, an etching, an applying an electroconductive paste, and a printing an electroconductive paste.

Metallic materials such as Au, Ag, Cu, Al, Pt, Ni, Mo, W, Sn, Zn, As, In, Ge, Pb, Pd, and Bi, or alloys in which a plurality of these metallic materials is combined, can be used as a material of the first protruding electrode 102a and the second protruding electrode 102b.

Moreover, for a material of the first protruding electrode 102a and the second protruding electrode 102b, combinations of metals which may be obtained by a diffusion joining, and joining by a metallic bonding are used. Examples are a structure in which the first protruding electrode 102a is made of Au and the second protruding electrode 102b is made of Al, and a structure in which both the first protruding electrode 102a and the second protruding electrode 102b are made of Au. Moreover, in some cases, a functional resin material such as an electroconductive resin is used as the first protruding electrode 102a and the second protruding electrode 102b.

Intermediate substrates 103 are provided between the first substrate 101a and the second substrate 101b. A substrate such as an organic substrate, a ceramic substrate, a glass substrate, a Si substrate, a metal substrate, and a flexible substrate can be used for the intermediates substrates 103. Moreover, it is also possible to use a composite material substrate in which these substrates are combined.

Openings 105 are provided in the intermediate substrates 103 in a direction of a plane and a direction perpendicular to the intermediate substrate 103. Examples of methods for providing the openings 105 are a drilling method, a punching method, a laser machining method, and the etching method. An appropriate method for machining is selected according to the material of the intermediate substrate 103 which is to be machined, and dimensions of the opening 105.

Mounted components 104 are provided on the second substrate 101b. As shown in FIG. 1, the first substrate 101a and the second substrate 101b are joined with the intermediate substrates 103 sandwiched between the first substrate 101a and the second substrate 101b. The mounted components 104 are disposed in a space between the first substrate 101a and the second substrate 101b.

The mounted components 104 in combination with other components mounted on another substrate which is electrically connected by some method to a mounted substrate and a pattern formed on a substrate which is not shown in a diagram, form an electronic circuit having a predetermined function. Examples of the mounted components 104 are a chip resistor, a mini-mold transistor, and a BGA (Ball Grid Array). However, the mounted components 104 are not restricted to these components.

Moreover, although it is not shown in the diagram, it is also possible to form an electrode between the first substrate 101a and the first protruding electrode 102a, and between the second substrate 101b and the second protruding electrode 102b, for bringing the first protruding electrode 102a and the second protruding electrode 102b in electrical conduction, and helping to form the first protruding electrode 102a and the second protruding electrode 102b on the first substrates 101a and the second substrate 101b respectively.

Next, a positional relationship of each structural component will be described below. The first substrate 101a and the second substrate 101b are disposed such that the surfaces on which, the protruding electrodes are formed, are let to face mutually. Moreover, although it is not shown in the diagram, in some cases, the protruding electrodes are provided on both surfaces of the first substrate 101a and the second substrate 101b.

A positional relationship between the first substrate 101a and the second substrate 101b, in a direction in an x-y plane (refer to FIG. 2), is determined with reference to a positional relationship of the first protruding electrode 102a and the second protruding electrode 102b which are joined. Regarding the positional relationship of the first protruding electrode 102a and the second protruding electrode 102b, a central position of a projection diagram in which the first protruding electrode 102a and the second protruding electrode 102b are viewed from an upward direction or a downward direction, in other word from a direction of a z-axis (refer to FIG. 2), is aligned by adjusting the corresponding first protruding electrode 102a and the second protruding electrode 102b. An allowable error in arrangement in this case is a total of a positional accuracy of an alternate formation of the first protruding electrode 102a and the second protruding electrode 102b, and an accuracy of positioning of equipment which handles each of the first substrate 101a and the second substrate 101b.

The positional relationship of the intermediate substrate 103, the first substrate 101a, and the second substrate 101b is determined with reference to a positional relationship of the first protruding electrode 102a, the second protruding electrode 102b, and the openings 105 formed in the intermediate substrate 103.

A central position of a projection diagram in which the first projecting electrode 102a, the second projecting electrode 102b, and the opening 105 in the intermediate substrate 103 are viewed from an upward direction or a downward direction, in other words a direction of z-axis, is aligned by adjusting the corresponding first protruding electrode 102a, the second protruding electrode 102b, and the opening 105. An allowable positional accuracy in this case is a total of a positional accuracy of the opening 105 in the intermediate substrate 103, the first protruding electrode 102a, and the second protruding electrode 102b in both x-y directions, a form error of the first protruding electrode 102a and the second protruding electrode 102b, a form error of the opening 105 in the intermediate substrate 103, an accuracy of positioning of equipment which handles the first substrate 101a and the second substrate 101b in which the first protruding electrode 102a and the second protruding electrode 102b are formed, and a positioning accuracy of equipment which handles the intermediate substrate 103.

A surface of the first substrate 101a on which the first protruding electrode 102a is formed and a surface of the second substrate 101b on which the second protruding electrode 102b is formed are disposed at positions in contact with each of surfaces of the intermediate substrate 103 corresponding to each of the first substrate 101a and the second substrate 101b.

Moreover, although it is not shown in the diagram, sometimes a material layer for joining is provided between the intermediate substrate 103 and each of the first substrate 101a and the second substrate 101b, when a material for joining is provided between the intermediate substrate 103, and each of the first substrate 101a and the second substrate 101b.

Next, after positioning each member according to the abovementioned procedure, the first protruding electrode 102a and the second protruding electrode 102b are brought into contact, then heated and pressurized. Accordingly, the first protruding electrode 102a and the second protruding electrode 102b are joined.

At this time, a heating method is one of the following methods (1), (2), and (3).

(1) A direct heating method in which a heater is brought into a direct contact with the first protruding electrode 102a and the second protruding electrode 102b, or with a member near the first protruding electrode 102a and the second protruding electrode 102b, and the first protruding electrode 102a and the second protruding electrode 102b are heated.

(2) An indirect heating method in which the first protruding electrode 102a and the second protruding electrode 102b, or a member near the first protruding electrode 102a and the second protruding electrode 102b are heated by irradiating a laser or spraying hot air.

(3) An overall heating method in which the entire mounting structure including the first protruding electrode 102a and the second protruding electrode 102b is heated by raising up a surrounding atmospheric temperature.

From among these heating methods, an appropriate method is selected according to specifications of the stacked mounting structure. It is desirable to activate a surface of the first protruding electrode 102a and the second protruding electrode 102b by a material such as plasma and an active material, before bringing the first protruding electrode 102a and the second protruding electrode 102b into contact. Accordingly, it becomes easy to joint the first protruding electrode 102a and the second protruding electrode 102b. Furthermore, it is desirable to apply ultrasonic waves on the first protruding electrode 102a and the second protruding electrode 102b, at the same time when being heated and pressurized. Accordingly, it becomes easy to join the first protruding electrode 102a and the second protruding electrode 102b.

Next, an action of the first embodiment will be described below. For example, in a conventional technology disclosed in Japanese Patent Application Kokoku (Post Exam Application) No. Hei 4-38417, an electrical conduction between substrates which are disposed by stacking was ensured by a lead wire, as it has been described above. Therefore, this technology in which an automation of joining the substrates is difficult and a degree of difficulty of the job is high, leads to an increase in a cost of mounting, and decline in productivity. Moreover, in a structure according to the conventional technology, a reduction in size of the mounting structure is also difficult.

Whereas, in the first embodiment, an electrical conduction between the first substrate 101a and the second substrate 101b which are stacked is ensured by joining of, and a contact between the first protruding electrode 102a and the second protruding electrode 102b. Moreover, it is possible to form the first protruding electrode 102a and the second protruding electrode 102b by a job using an automatic machine. The job involved does not require any special skill.

Moreover, when the first protruding electrode 102a and the second protruding electrode 102b are stud bumps for example, a diameter of the first protruding electrode 102a and the second protruding electrode 102b is about 100 µm. Therefore, it is possible to make a joining portion smaller than the lead wire.

As a result, in the first embodiment, in the stacked mounting structure, it is possible to realize the automation of job and the reduction in the size of the mounting structure which were difficult in the conventional technology.

Moreover, in a structure disclosed in Japanese Patent Application-Laid-open Publication No. Hei 11-111914, for joining an electroconductive spacer (which corresponds to the intermediate substrate 103 in the first embodiment) and an anisotropic electroconductive film, an electrode was provided on a through hole (which corresponds to the opening 105 in the intermediate substrate in the first embodiment) in the spacer. Moreover, in the structure according to the conventional technology, it is difficult to reduce a projected area from an upper portion of the mounting structure.

Whereas, in the first embodiment, the first protruding electrode 102a and the second protruding electrode 102b are joined directly. Therefore, only the opening 105 is to be provided in the intermediate substrate 103. Accordingly, it is possible to narrow a pitch of a joining portion. As a result of this, it is possible to reduce a projected area from an upper portion of the stacked mounting structure 100.

Thus, in the first embodiment, since it is possible to accommodate a joining member and a joining portion in the opening 105 of the intermediate substrate 103, it is possible to reduce a dimension in a direction of thickness of substrate. Moreover, since the mounting is possible without providing an electrode near the joining portion, it is possible to perform a high densification of the stacked mounting structure by an amount of omission of the electrode. Furthermore, the mounting is possible by using an automation machine which can be procured easily in general.

As it has been described above, according to the first embodiment, it is possible to provide a stacked mounting structure of which the size can be reduced to decrease the projected area in a direction of plane of the substrate. Moreover, it is possible to provide a stacked mounting structure of which a manufacturing process is automated and productivity is improved.

Second Embodiment

Figure 3:
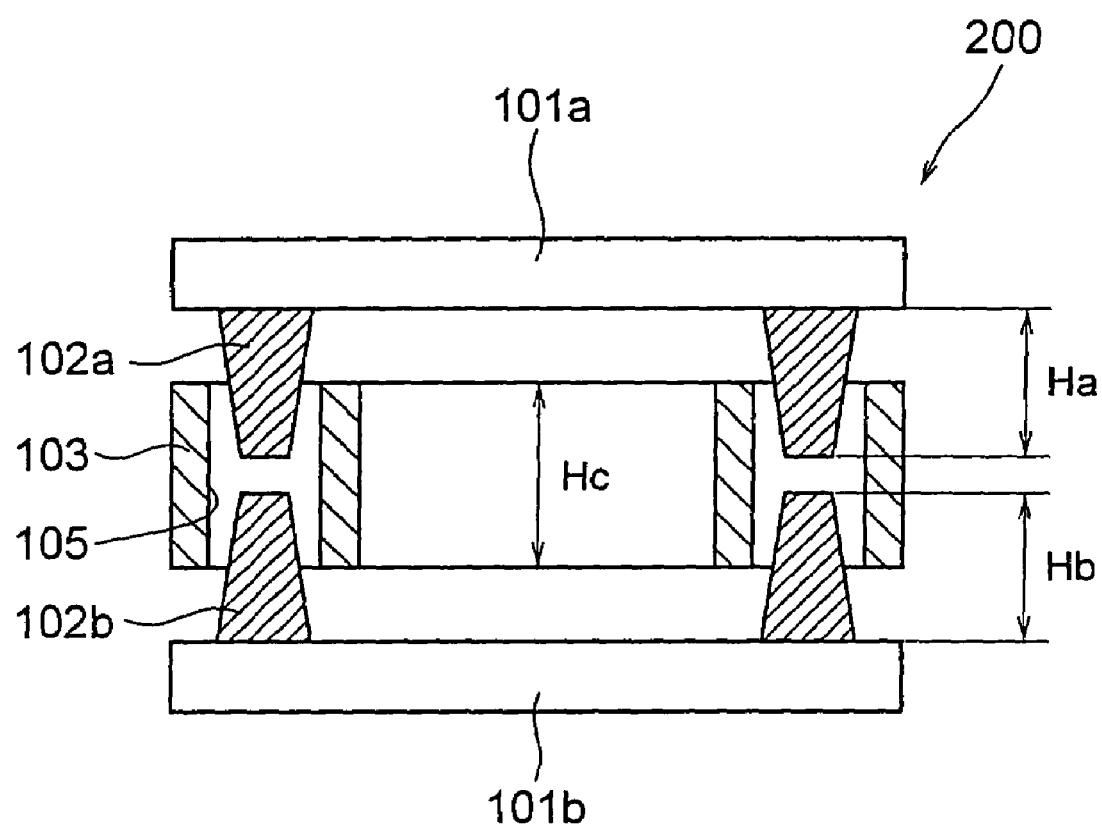
FIG. 3 is a diagram showing a cross-sectional view of a stacked mounting structure according to a second embodiment of the present invention.

Next, a stacked mounting structure 200 according to a second embodiment will be described below. FIG. 3 shows a cross-sectional view of a state before joining the stacked mounting structure 200. Same reference numerals are assigned to components which are same as in the first embodiment, and repeated description is omitted.

In the second embodiment, as shown in FIG. 3, a height of the first protruding electrode 102a is Ha and a height of the second protruding electrode 102b is Hb, and a combined height Ha+Hb which is a total of the two heights Ha and Hb is more than a height Hc of the intermediate substrate 103. At the same time, each of the first protruding electrode 102a and the second protruding electrode 102b has a shape in which a front end is the narrowest.

In other words, the heights Ha and Hb of the first protruding electrode 102a and the second protruding electrode 102b respectively, and the height Hc (thickness) of the intermediate electrode 103 satisfy the following equation (1)

$$Ha+Hb>Hc \qquad (1)$$

At the time of manufacturing the stacked mounting structure 200 of the second embodiment, first of all, the first protruding electrode 102a and the second protruding electrode 102b are pressurized and heated. Accordingly, the first protruding electrode 102a and the second protruding electrode 102b are deformed in a direction of compression. When the first protruding electrode 102a and the second protruding electrode 102b are deformed in the direction of compression, each of the first protruding electrode 102a and the second protruding electrode 102b is deformed such that a dimension in a direction of height is decreased and a diameter is increased.

Due to such deformation when a diameter of the first protruding electrode 102a and a diameter of the second protruding electrode 102b become bigger than a diameter of the opening 105 in the intermediate substrate 103, the first protruding electrode 102a and the second protruding electrode 102b make a contact with an inner wall of the opening 105 in the intermediate substrate 103. Accordingly, the first protruding electrode 102a, the second protruding electrode 102b, and the intermediate substrate 103 can be fixed by a frictional force. Accordingly, it is possible to prevent the intermediate substrate 103 from moving when an external force is exerted.

According to the second embodiment, it is possible to provide a sturdier stacked mounting structure in which the first protruding electrode 102a, the second protruding electrode 102b, and the intermediate substrate 103 are fixed.

Moreover, in the structure according to the conventional technology, steps for fixing the intermediate substrate 103 to each of the first substrate 101a and the second substrate 101b are to be provided separately. If such steps of fixing are not provided, the intermediate substrate 103 is in a state of being sandwiched between the first substrate 101a and the second substrate 101b. Therefore, when an external force is exerted, there is a possibility that the intermediate substrate 103 is moved. Whereas, in the second embodiment, it is possible to fix the intermediate substrate 103, while eliminating the steps of fixing the intermediate substrate 103 to the first substrate 101a and the second substrate 101b.

Thus, according to the second embodiment, it is possible to provide a stacked mounting structure which is sturdier, and in which the mounting is easy.

Third Embodiment

Figure 4:
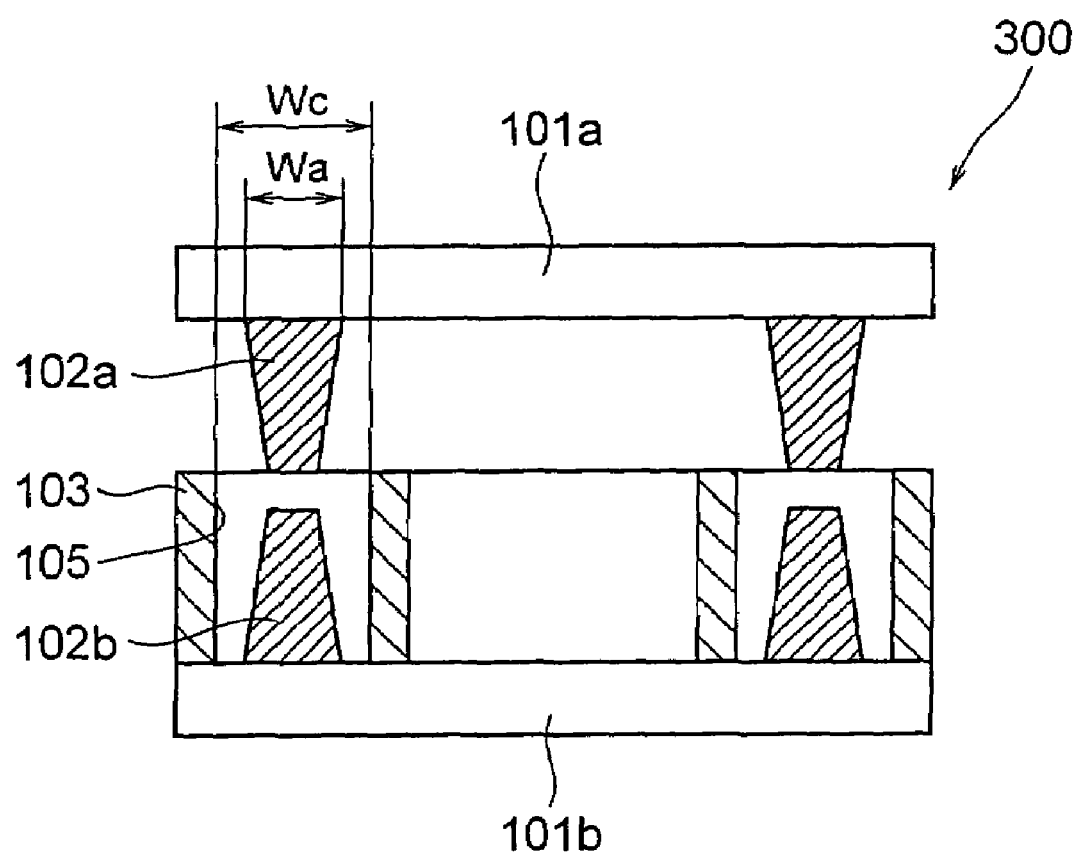
FIG. 4 is a diagram showing a cross-sectional view of a stacked mounting structure according to a third embodiment of the present invention.

Next, a stacked mounting structure 300 according to a third embodiment of the present invention will be described below. FIG. 4 shows a cross-sectional view of a state before joining the stacked mounting structure 300. Same reference numerals are assigned to components which are same as in the first embodiment, and the repeated description is omitted.

In the third embodiment, as shown in FIG. 4, in a state before joining each member, a maximum diameter Wa of the first protruding electrode 102a and the second protruding electrode 102b is smaller than a diameter Wc of the opening 105 in the intermediate substrate 105.

In other words, the maximum diameter Wa of the first protruding electrode 102a and the second protruding electrode 102b, and the diameter Wc of the opening in the intermediate substrate 103 satisfy the following equation (2).

$$Wc > Wa \quad (2)$$

Next, an action of the third embodiment will be described below. By satisfying the equation (2), it is possible to lower a pressure at the time of mounting, as compared to when the maximum diameter of the first protruding electrode 102a and the second protruding electrode 102b is not less than the diameter of the opening in the intermediate substrate 103.

Figure 5A:
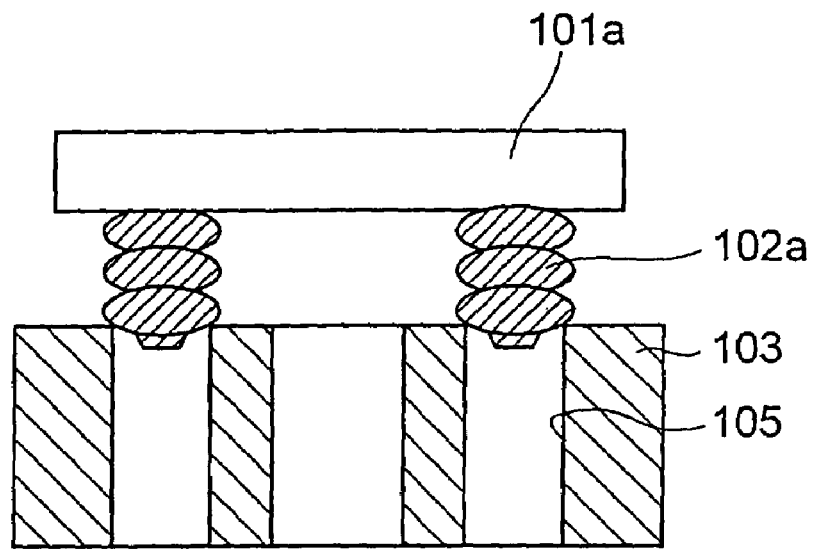
FIG. 5A, FIG. 5B, are diagrams showing a state of interference during manufacturing the stacked mounting structure.
Figure 5B:
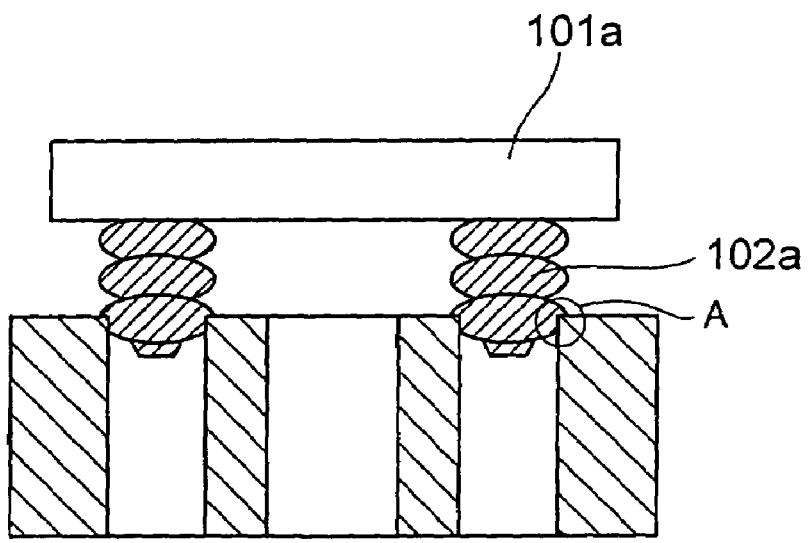

FIG. 5A and FIG. 5B show steps of joining when the maximum diameter of the first protruding electrode 102a and the second protruding electrode 102b is not less than the diameter of the opening 105 in the intermediate substrate 103. In FIG. 4, each of the first protruding electrode 102a and the second protruding electrode 102b has a tapered shape such that the electrodes are narrowed progressively toward the front end portion. Whereas, in FIG. 5A and FIG. 5B, the first protruding electrode 102a and the second protruding electrode 102b are shown as a shape in which a plurality of protruding electrodes are stacked in a direction of height.

In FIG. 5A, at the time of mounting, the intermediate substrate 103, and the opening 105 in the intermediate substrate 103 interfere physically with the first protruding electrode 102a. The description, being similar for the second protruding electrode 102b, is omitted.

Thus, at the step in FIG. 5A and FIG. 5B, a mounting is such that the first protruding electrode 102a and having a diameter greater as compared to the diameter of the opening 105 in the intermediate substrate 103 is press fitted in the opening 105 in the intermediate substrate 103. Therefore, a load exerted by a pressure acts on the first protruding electrode 102a, a mounting portion of the first protruding electrode 102a, an area near this mounting portion, and furthermore an area near the opening 105 in the intermediate substrate 103.

Moreover, as shown in FIG. 5B, as the pressure is applied further, the first protruding electrode 102a goes on entering into the opening 105 while undergoing a plastic deformation. At this time, a mechanical stress such as a compressive stress or the frictional force is generated in a portion A at which the first protruding electrode 102a and the opening 105 interfere.

Whereas, in the third embodiment, each of the diameter of the first protruding electrode 102a and the diameter of the second protruding electrode 102b is smaller than the diameter of the opening 105 which is provided in the intermediate substrate 103, the first protruding electrode 102a is disposed in the opening 105 of the intermediate substrate 103, while deforming the first protruding electrode 102a. Therefore, in a structure according to the third embodiment, the opening 105 in the intermediate substrate 103, and the first protruding electrode 102a do not interfere. Therefore, it is possible to reduce a pressure at the time of mounting. Furthermore, it is possible to reduce damage such as breaking and failure of members caused by the pressure.

An example of a device to which the present invention can be applied is an MEMS (Micro Electro Mechanical System) device. The MEMS device is a light-weight, thin, and small structured device manufactured by a silicon process.

A light-weight, thin, and small structured device is susceptible to be affected by an external force. Therefore, there are quite a lot of cases in which the light-weight, thin, and small structured device is damaged by an external force mentioned above. Consequently, the third embodiment is effective while assembling a device and a member which is sensitive to such external force.

According to the third embodiment, it is possible to provide a stacked mounting structure in which members in a favorable state due to less load exerted during the mounting are used.

Fourth Embodiment

Figure 6:
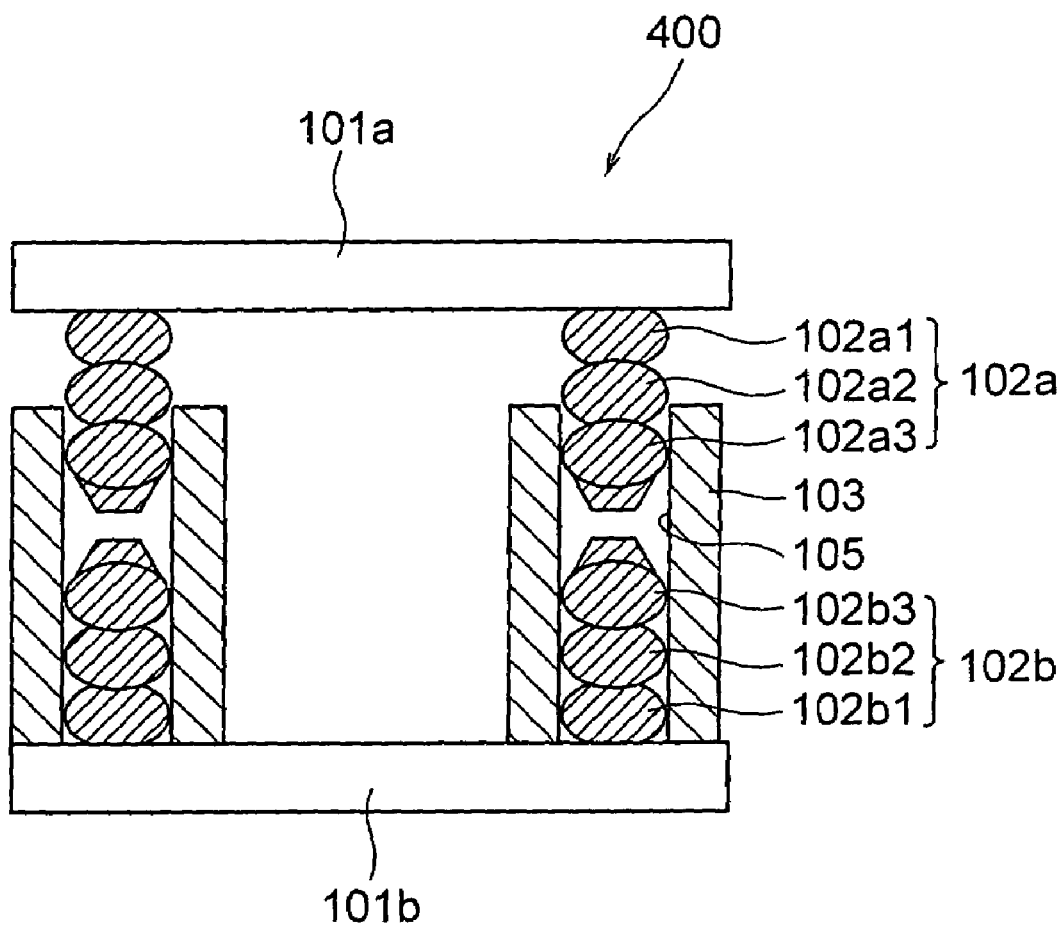
FIG. 6 is a diagram showing a cross-sectional view of a stacked mounting structure according a fourth embodiment of the present invention.

Next, a stacked mounting structure 400 according to a fourth embodiment of the present invention will be described below. FIG. 6 shows a cross-sectional view of a state before joining the stacked mounting structure 400. Same reference numerals are used for components which are same as in the first embodiment, and the repeated description is omitted.

In the fourth embodiment, the first protruding electrode 102a is formed by stacking a plurality of layers, such as three layers of protruding electrodes 102a1, 102a2, and 102a3, each protruding electrode having a ratio of a width to a height 1:1, in other words an aspect ratio 1:1. Similarly, the second protruding electrode 102b is formed by stacking a plurality of layers of protruding electrodes 102b1, 102b2, and 102b3, each protruding electrode having the ratio of the width to the height 1:1. The protruding electrodes are so-called stud bumps.

In the fourth embodiment, the mounting is possible even in a case in which the aspect ratio of the opening 105 in the intermediate substrate 103 is high. For example, when the aspect ratio of the opening 105 in the intermediate substrate 103 is high, in other words, when the diameter of the opening 105 is small, and the height (thickness) of the intermediate substrate 103 is large, the first protruding electrode 102a is disposed inside such opening 105.

Generally, at the time of preparing the protruding electrode, the aspect ratio, in other words, the ratio of the diameter to the height of the protruding electrode is about 1:1. Therefore, generally, the aspect ratio cannot be increased much. Moreover, when the aspect ratio of the opening 105 in the intermediate substrate 103 is high, in a protruding electrode having a general structure, sometimes the first protruding electrode 102a and the second protruding electrode 102b facing mutually, do not come in contact.

Whereas, in the fourth embodiment, the plurality of protruding electrodes such as 102a1, 102a2, and 102a3, is stacked. Therefore, it is possible to increase the aspect ratio of the first protruding electrode 102a. As a result of this, the mounting is possible even when the aspect ratio of the opening 105 in the intermediate substrate 103 is high. Consequently, it is highly advantageous from a point of view of improving a degree of freedom of designing, while designing the stacked mounting structure.

According to the fourth embodiment, it is possible to provide a stacked mounting structure with the high aspect ratio of the opening 105 in the intermediate substrate 103.

(Manufacturing Method)

Figure 7A:
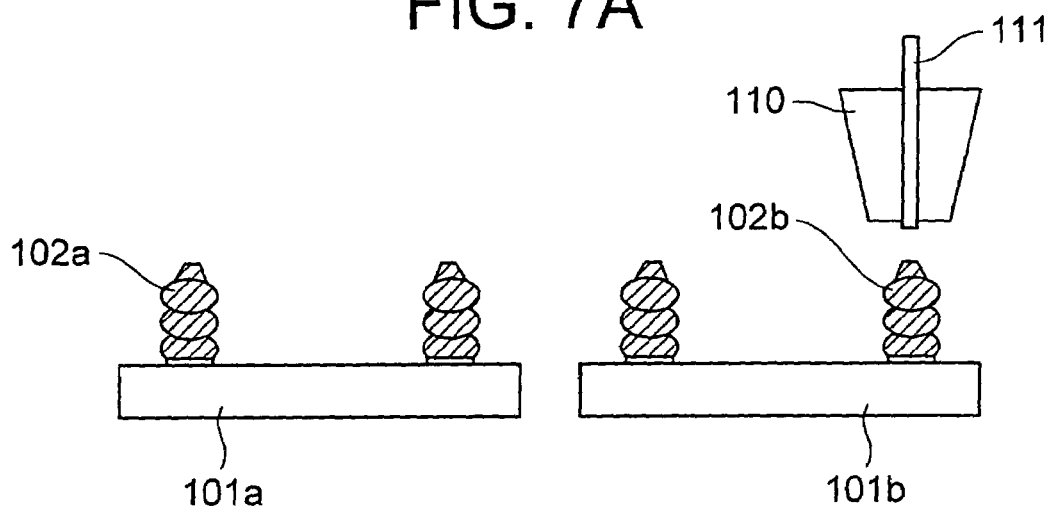
FIG. 7A, FIG. 7B, and FIG. 7C are diagrams showing a manufacturing process of the stacked mounting structure according to the fourth embodiment.

Next, a procedure for method of manufacturing the stacked mounting structure will be described below. FIG. 7A, FIG. 7B, and FIG. 7C, and FIG. 8A and FIG. 8B show the procedure for manufacturing. In FIG. 7A, the first protruding electrode 102a and the second protruding electrode 102b are formed on one surface of the first substrate 101a and the second substrate 101b respectively. The protruding electrodes are formed of a protruding electrode material thin wire 111 as a material, by using a protruding electrode making tool 110.

Figure 7B:
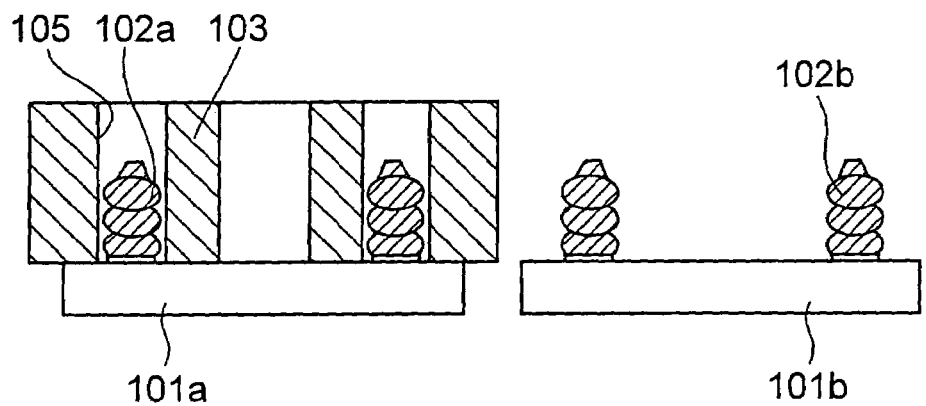

In FIG. 7B, the intermediate substrate 103 is disposed on the first substrate 101a. At this time, the first protruding electrode 102a and the second protruding electrode 102b are disposed such that the position of each protruding electrode is matched with a position of the opening 105 in the intermediate substrate 103.

Figure 7C:
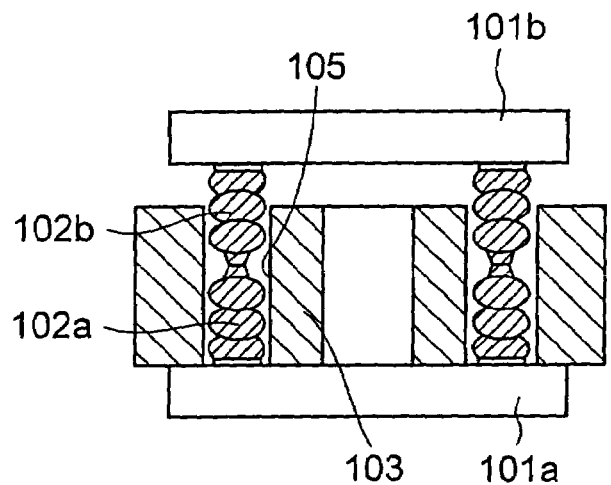

In FIG. 7C, the second substrate 102b is disposed to face the first substrate 101a. At this time, the substrates are disposed such that the position of the opening 105 in the intermediate substrate 103 is matched with the position of the second protruding electrode 102b. This corresponds to a step of facing. Moreover, although it is not shown in the diagram, at a step of disposing, the intermediate substrate 103 is disposed between the first substrate 101a and the second substrate 101b.

Figure 8A:
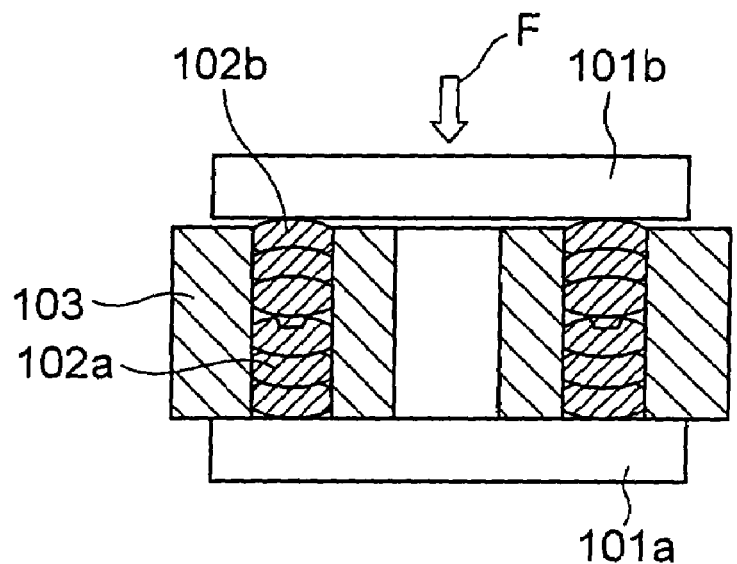
FIG. 8A and FIG. 8B are diagrams showing another manufacturing process of the stacked mounting structure according to the fourth embodiment.

In FIG. 8A, the second substrate 101b is heated. Next, a pressure F is applied on the second substrate 101b, in a direction of the first substrate 101a. Accordingly, the first protruding electrode 102a and the second protruding electrode 102b are deformed further substantially in a radial direction, and deformed less in a direction of height.

Figure 8B:
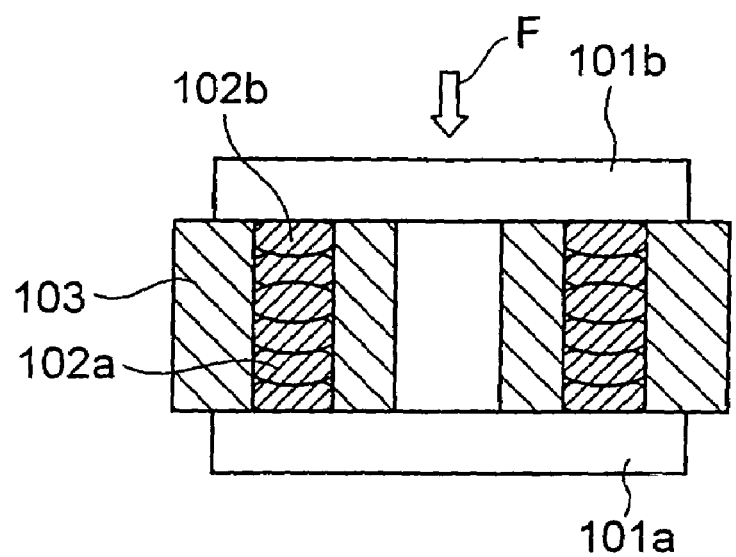

In FIG. 8B, the pressure F is applied till the second substrate 101b and the intermediate substrate 103 make a contact, and the first protruding electrode 102a and the second protruding electrode 102b are joined. This corresponds to a step of joining. According to such procedure, it is possible to obtain a stacked mounting structure having a structure described above. In this procedure for manufacturing, it is more preferable that equation (1) and equation (2) are satisfied.

Fifth Embodiment

Figure 9:
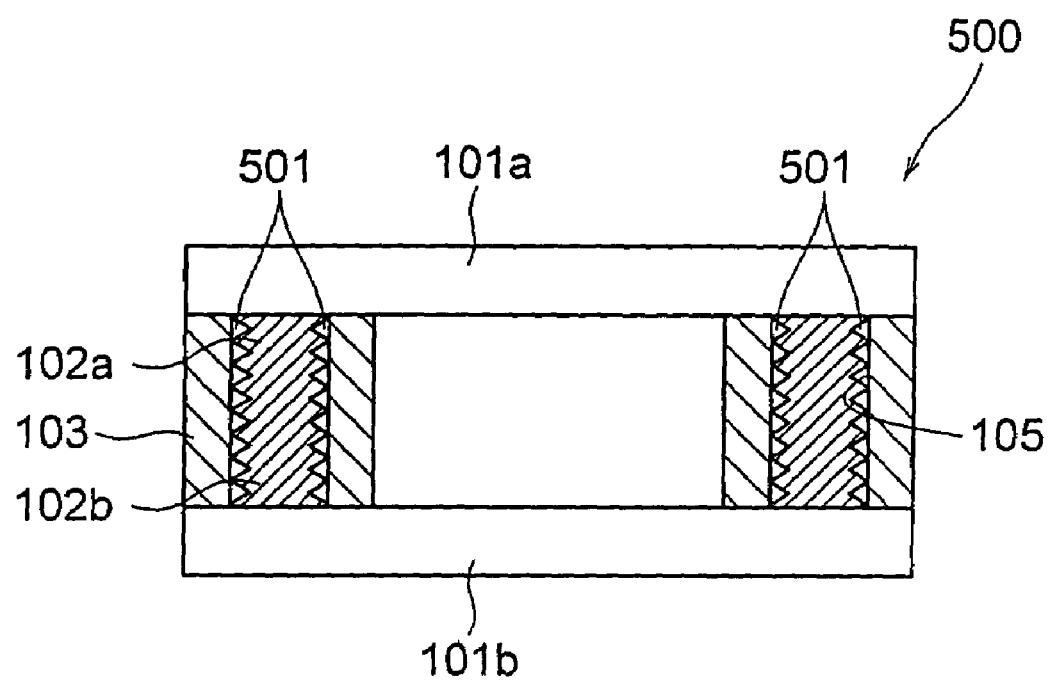
FIG. 9 is a diagram showing a cross-sectional view of a stacked mounting structure according to fifth embodiment of the present invention.

Next, a stacked mounting structure 500 according to a fifth embodiment of the present invention will be described below. FIG. 9 shows a cross-sectional view of a state before joining the stacked mounting structure 500. Same reference numerals are assigned to components which are same as in the first embodiment, and the repeated description is omitted.

In the fifth embodiment, a portion having concavities and convexities 501 is formed on the inner wall of the opening 105 in the intermediate substrate 103. Examples of methods for processing the portion having concavities and convexities 501 are chemical methods such as an etching, and physical methods such as a sand blasting. However, the method for processing is not restricted to a particular method provided that a structure similar to a structure obtained by the chemical method or the physical method is obtained by any other method.

Next, an action of the fifth embodiment will be described below. In the fifth embodiment, it is possible to increase an area of contact between the first protruding electrode 102a and the second protruding electrode 102b, and the inner wall of the opening 105 in the intermediate substrate 103. Accordingly, the area of contact between the first protruding electrode 102a and the second protruding electrode 102b, and the inner wall of the opening 105 in the intermediate substrate 103, is increased. Therefore, a stacked mounting structure 500 becomes sturdy.

According to the fifth embodiment, it is possible to provide the sturdy stacked mounting structure 500.

Sixth Embodiment

Figure 10:
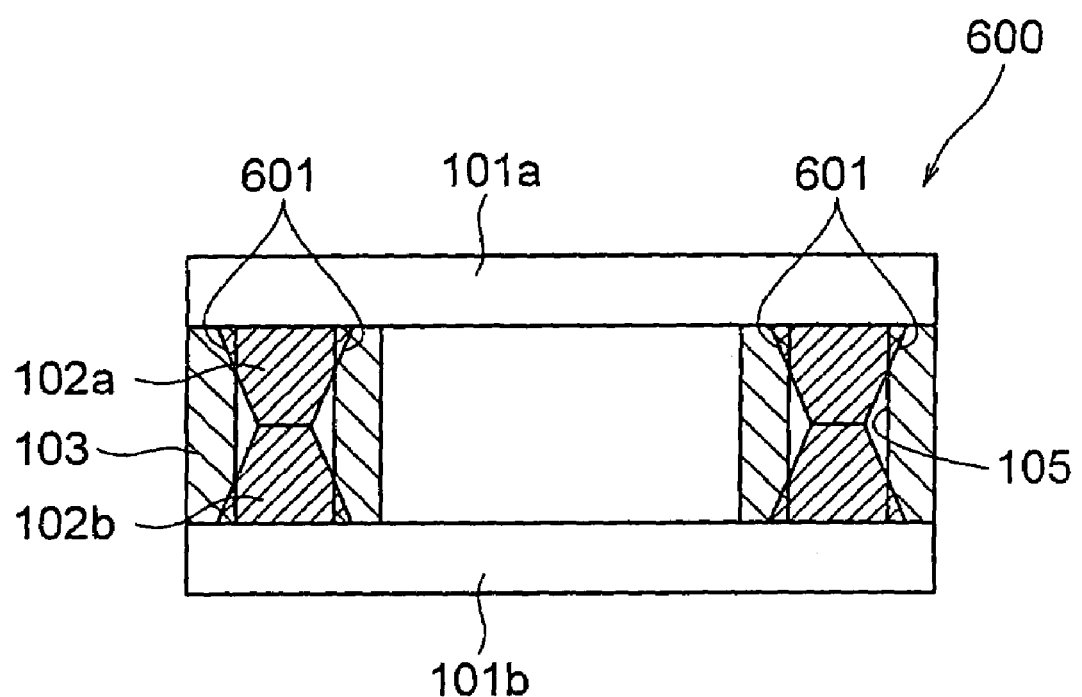
FIG. 10 is a diagram showing a cross-sectional view of a stacked mounting structure according to a sixth embodiment of the present invention.

Next, a stacked mounting structure 600 according to a sixth embodiment of the present invention will be described below. FIG. 10 shows a cross-sectional view of the stacked mounting structure 600. Same reference numerals are assigned to components which are same as in the first embodiment, and the repeated description is omitted.

In the sixth embodiment, a chamfer 601 is formed on an angular portion of the inner wall of the opening 105 in the intermediate substrate 103. Examples of method for processing the chamfer 601 are chemical methods such as the etching, and physical methods such as a laser machining. However, the method for processing is not restricted to a particular method provided that a structure similar to a structure obtained by the chemical method or the physical method is obtained by any other method.

Next, an action of the sixth embodiment will be described below. In the sixth embodiment, the first protruding electrode 102a and the second protruding electrode 102b after mounting, have a shape such that each of the electrodes is inclined at a base. According to such a shape, it is possible to reduce a concentration of stress at the base of the first protruding electrode 102a and the second protruding electrode 102b, an area around the base of the electrodes, and furthermore, a joining portion of the first protruding electrode 102a and the second protruding electrode 102b.

As a general phenomenon, when a thermal stress due to a temperature change, and a load stress due to bending, vibration, and an impact acts on the stacked mounting structure, the load stress acts in a concentrated manner on a portion of stress concentration. As a result of this, a crack is developed from the portion of stress concentration, which sometimes leads to damage. According to the sixth embodiment, it is possible to reduce such crack and damage. Moreover, in the sixth embodiment, the area of contact between the first protruding electrode 102a and the second protruding electrode 102b, and the inner wall of the opening 105 in the intermediate substrate, is increased. Therefore, it is possible to make the mounting structure sturdy.

According to the sixth embodiment, it is possible to provide the stacked mounting structure 600 which is sturdy, and which has an excellent reliability of a portion joining the protruding electrodes.

Seventh Embodiment

Figure 11:
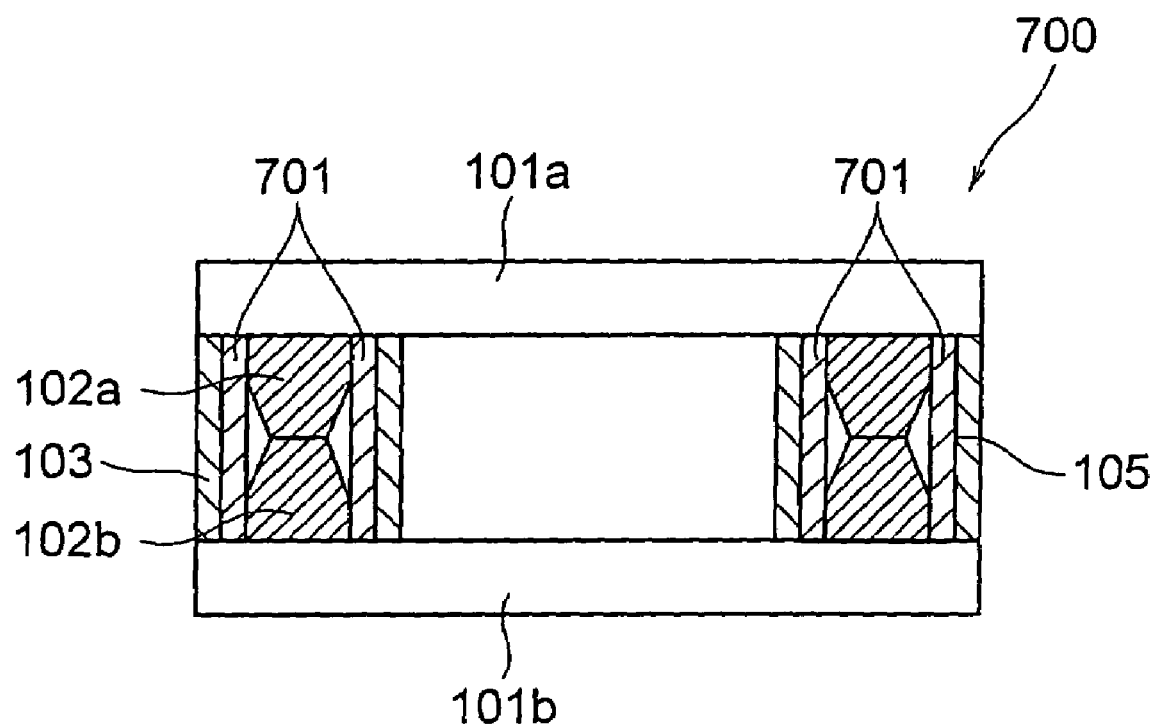
FIG. 11 is a diagram showing a cross-sectional view of a stacked mounting structure according to a seventh embodiment of the present invention.

Next, a stacked mounting structure 700 according to a seventh embodiment of the present invention will be described below. FIG. 11 shows a cross-sectional view of the stacked mounting structure 700. Same reference numerals are assigned to components same as in the first embodiment, and the repeated description is omitted.

In the seventh embodiment, acetal film 701 which is capable of joining the first protruding electrode 102a and the second protruding electrode 102b, on the inner wall of the opening 105 in the intermediate substrate 103 is formed. The metal film 701 is formed by a method such as the plating, the sputtering, and an extraction. Moreover, the method for forming is not restricted to a particular method, provided that a structure shown in FIG. 11 is obtained.

Examples of a material for the metal film 701 are metallic materials such as Au, Ag, Cu, Al, Pt, Ni, Mo, W, Sn, Zn, As, In, Ge, Pb, Pd, and Bi, and alloys in which a plurality of these metallic materials is combined. For a material of the metal film 701, corresponding to a metal or an alloy which forms the first protruding electrode 102a and the second protruding electrode 102b, a metal which is joined by the diffusion joining, and by the metallic bonding, is used. Examples are a structure in which the first protruding electrode 102a and the second protruding electrode 102b are made of Au, and the metal film 701 is made of Al, and a structure in which the first protruding electrode 102a and the second protruding electrode 102b, as well as the metal film 701 are made of Au.

Next, an action of the seventh embodiment will be described below. According to the seventh embodiment, at the time of mounting the first protruding electrode 102a and the second protruding electrode 102b, and the metal film 701 formed on the inner wall of the opening 105 in the intermediate substrate 103 are joined by heating and pressurizing. Accordingly, a joining strength of the first protruding electrode 102a and the second protruding electrode 102b, and the opening in the intermediate substrate 103, is improved remarkably.

Moreover, when each of the first protruding electrode 102a, the second protruding electrode 102b, and the metal firm 701 is formed of an electroconductive material, and an electroconductive layer, it is possible to use the first protruding electrode 102a, the second protruding electrode 102b, and the metal film 701 as an electric circuit. Accordingly, it is possible to make use of the intermediate substrate 103 not only as a spacer but also as a functional component. As a result of this, a high densification of an electric circuit and a multi-functioning of a device to which the technology is applied, are facilitated.

According to the seventh embodiment, it is possible to provide a stacked mounting structure which is sturdy, and in which it is possible to use the first protruding electrode 102a, the second protruding electrode 102b, and the metal film 701 formed on the inner wall of the opening 105 in the intermediate member 103, as an electric circuit, and the high densification of an electric circuit and the multi-functioning of a device to which the technology is applied, are facilitated.

Eighth Embodiment

Figure 12A:
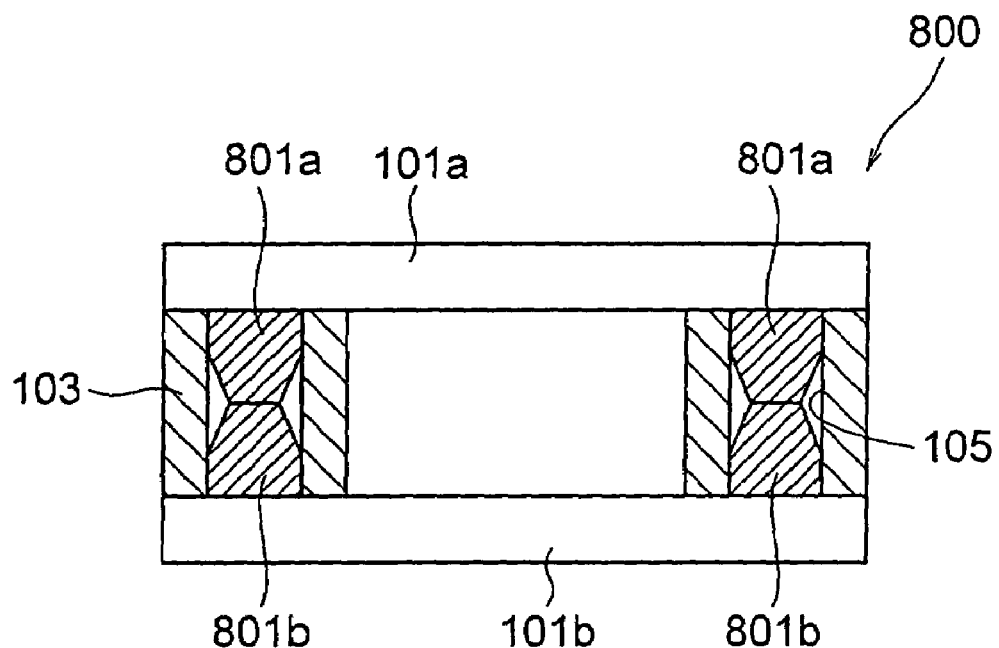
Figure 12B:
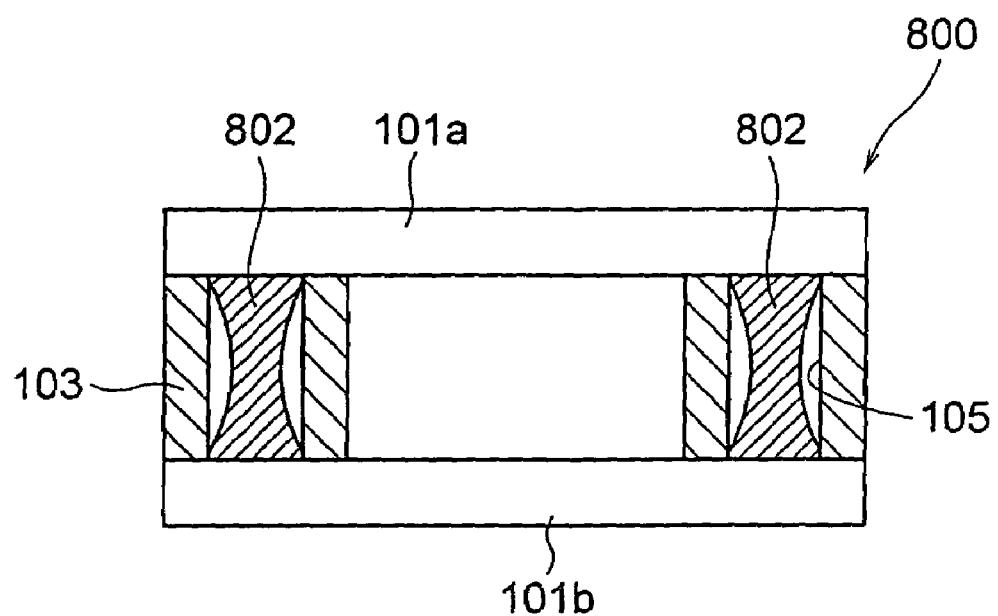

Next, a stacked mounting structure 800 according to an eighth embodiment of the present invention will be described below. FIG. 12A and FIG. 12B show cross-sectional views of the stacked mounting structure 800. Same reference numerals are assigned to components which are same as in the first embodiment, and the repeated description is omitted.

In the eighth embodiment, a first protruding electrode 801a and a second protruding electrode 801b are formed by a solder material. Examples of the solder material are an Sn—Pb solder, as well as an Au—Sn solder, an Sn—Ag—Cu solder, an Sn—Bi solder, and an Sn—In solder.

As shown in FIG. 12A, in a case of forming the first protruding electrode 801a and the second protruding electrode 801b by a solder material, to start with, electrodes are formed on the first substrate 101a and the second substrate 101b. Next, on the electrode, a solder paste is supplied by printing or by dispensing, and protruding electrodes are formed by a method such as melting by heating, and plating. The method is not restricted to any particular method provided that the abovementioned structure is obtained.

Further, as shown in FIG. 12B, a heating is performed by heating above a melting point of the solder material, and the solder is melted. Accordingly, a solder-material joining section 802 is formed. The first protruding electrode 801a and the second protruding electrode 801b which are solder-material protruding electrodes need not necessarily by one lump, and may be a structure formed by a fine material, such as a fine powder of solder in a hardened form.

Next, an effect of the eighth embodiment will be described below. According to the eighth embodiment, at the time of mounting, the first protruding electrode 801a and the second protruding electrode 801b are melted by heating to a temperature not less than a melting point of the solder material. Accordingly, the solder-material joining section 802 is formed. As a result of this, it is possible to join without applying pressure on the stacked mounting structure 800.

Figure 13A:
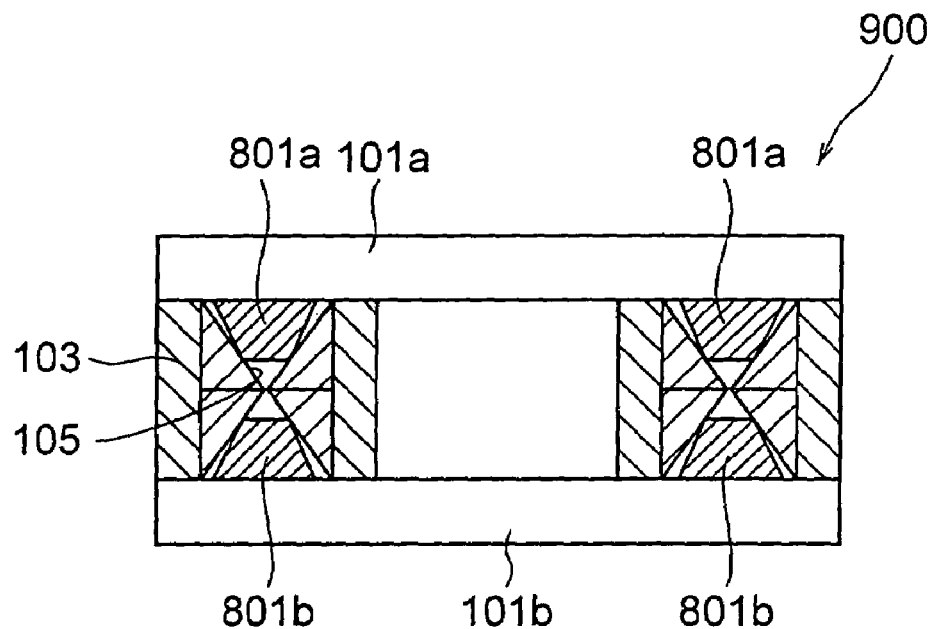
FIG. 13A and FIG. 13B axe diagrams showing cross sectional views of a stacked mounting structure according to a modified embodiment of the eighth embodiment.
Figure 13B:
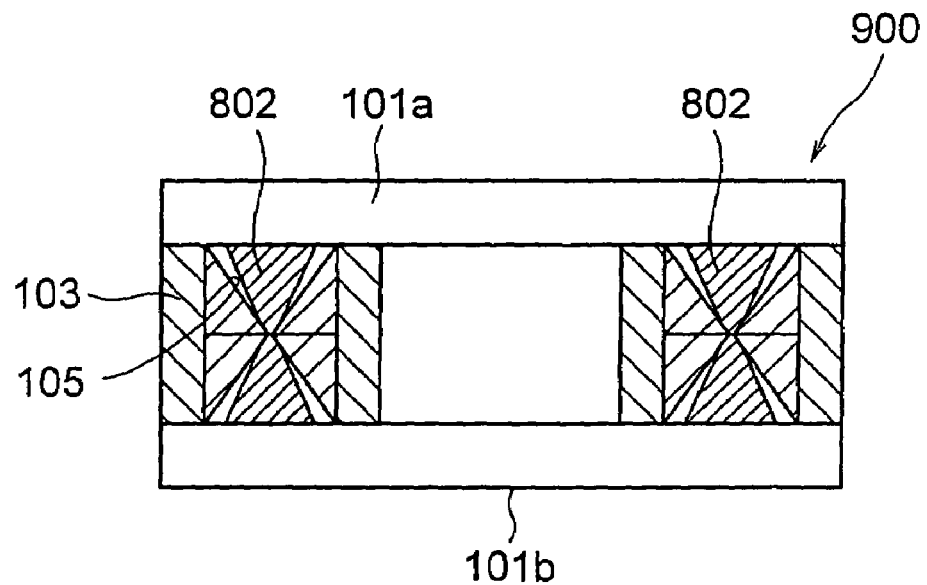

Moreover, as shown in modified embodiments in FIG. 13A and FIG. 13B, it is possible to make a shape of the opening 105 in the intermediate substrate 103 such that the opening 105 becomes smaller progressively toward a centre in a direction of the height of the intermediate substrate 103. Accordingly, by using a capillary phenomenon, joining of the solder materials can be further facilitated.

According to the eighth embodiment, it is possible to obtain a mounting structure without exerting hardly any pressure on the stacked mounting structure. In other words, the mounting is possible even for a member which has a low strength, particularly against the pressure. Moreover, it is possible to provide a stacked mounting structure in which, members in better state with less pressure load exerted at the time of mounting, are used.

Furthermore, in each of the embodiments described above, a stacked mounting structure in which two substrates are used is described. However, the present invention is not restricted to a stacked mounting structure in which two substrates are used, and a stacking structure may be such as a stacking structure 1000 which includes three substrates as shown in FIG. 14.

Figure 14:
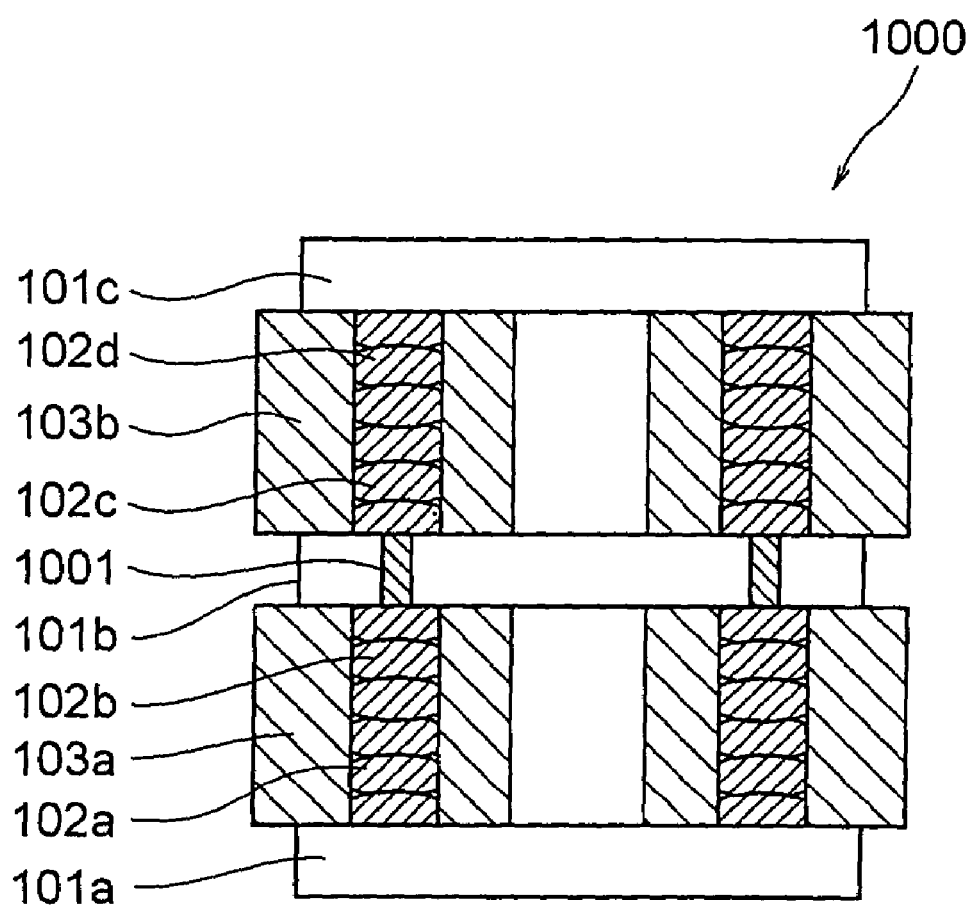
FIG. 14 is a diagram showing a cross-sectional view of a stacked mounting structure according to a modified embodiment of the present invention.
Figure 15:
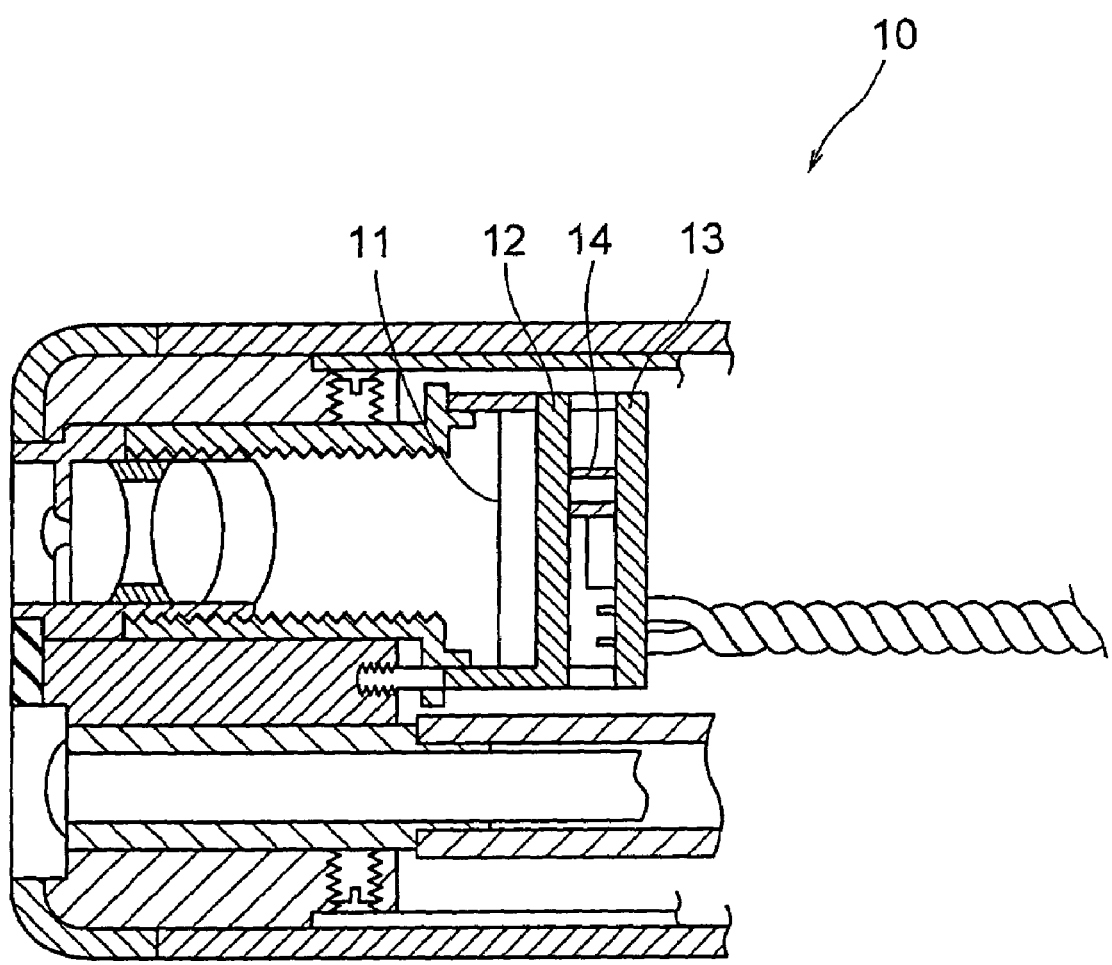
FIG. 15 is a diagram showing a schematic view of a stacked mounting structure according to a conventional technology.
Figure 16:
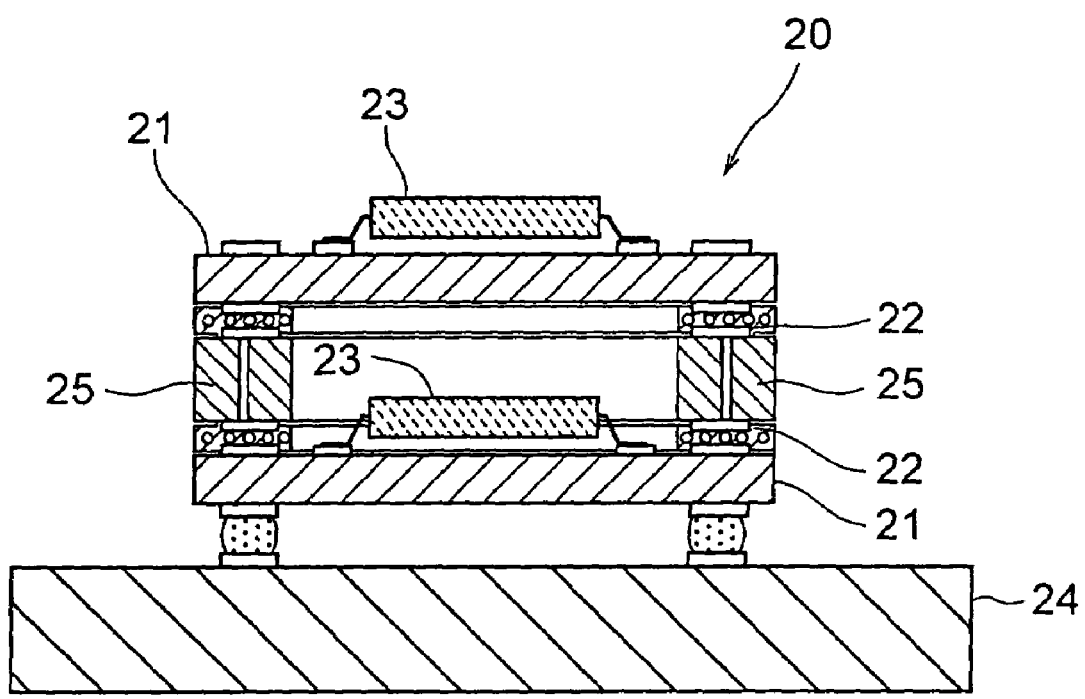
FIG. 16 is another diagram showing the schematic view of the stacked mounting structure according to the conventional technology.

In FIG. 14, an intermediate substrate 103a is formed between the-first substrate 101a and the second substrate 101b. Further, the first substrate 101a and the second substrate 101b are electrically connected by protruding electrodes 102a and 102b respectively.

Moreover, an intermediate substrate 103b is formed between the second substrate 101b and a third substrate 101c. The second substrate 101b and the third substrate 101c are electrically connected by protruding electrodes 102c and 102d respectively.

Furthermore, the protruding electrode 102b and the protruding electrode 102c are structured to be such that the protruding electrodes 102b and 102c are brought into electric conduction by an electroconductive member 1001. Thus, the present invention can achieve easily a stacking of a plurality of substrates. Moreover, the present invention can have various modifications which fairly fall within basic teaching herein set forth.

According to the present invention, there is shown an effect that it is possible to provide a stacked mounting structure in which a plurality of substrates is connected via spacers, and mounting components are mounted in a space between the substrates, such that an improvement in a yield, a reduction in a cost, and a shortening of a manufacturing time are realized by decreasing a number of manufacturing steps, while reducing a size by decreasing a projected area in a direction of plane of the substrates.

Thus, the stacked mounting structure of the present invention is useful as a structure having a small size, and easy to be manufactured.

What is claimed is:

1. A stacked mounting structure comprising:
   at least two members, a first member on a surface of which a first protruding electrode is formed, and a second member with a second protruding electrode formed on a surface facing the first member; and
   an intermediate member disposed between the first member and the second member, the intermediate member connecting and being in contact with the first member and the second member by forming a predetermined gap between the first member and the second member, wherein
   mounted components are disposed in the gap between the first member and the second member,
   the first protruding electrode and the second protruding electrode are connected in an opening which is provided in the intermediate member,
   a combined height of the first protruding electrode and the second protruding electrode is more than a height of the intermediate member in a state before contacting the stacked mounting structure, and
   a shape of the first protruding electrode and a shape of the second protruding electrode are such that a front end portion of each of the first protruding electrode and the second protruding electrode is narrowed progressively toward the front end portion.

2. The stacked mounting structure according to claim 1, wherein each of a maximum diameter of the first protruding electrode and a maximum diameter of the second protruding electrode are smaller than a diameter of the opening which is provided in the intermediate member.

3. The stacked mounting structure according to claim 2, wherein the first protruding electrode and the second protruding electrode are formed by stacking in stages a plurality of protruding electrodes having a ratio of width to height of 1:1.

4. The stacked mounting structure according to claim 3, wherein a chamfer is formed at an angular portion of an inner wall of the opening.

5. The stacked mounting structure according to claim 4, wherein the inner wall of the opening has concavities and convexities.

6. The stacked mounting structure according to claim 5, wherein the first protruding electrode and the second protruding electrode comprise Au.

7. The stacked mounting structure according to claim 4, wherein the first protruding electrode and the second protruding electrode comprise Au.

8. The stacked mounting structure according to claim 3, wherein the inner wall of the opening has concavities and convexities.

9. The stacked mounting structure according to claim 8, wherein a material of the first protruding electrode and the second protruding electrode is Au.

10. The stacked mounting structure according to claim 3, wherein the first protruding electrode and the second protruding electrode comprise Au.

11. The stacked mounting structure according to claim 1, wherein each of a maximum diameter of the first protruding electrode and a maximum diameter of the second protruding electrode are smaller than a diameter of the opening which is provided in the intermediate member.

12. The stacked mounting structure according to claim 1, wherein the first protruding electrode and the second protruding electrode are formed by stacking in stages a plurality of protruding electrodes having a ratio of width to height of 1:1.

13. The stacked mounting structure according to claim 1, wherein a chamfer is formed at an angular portion of an inner wall of the opening.

14. The stacked mounting structure according to claim 1, wherein an inner wall of the opening has concavities and convexities.

15. The stacked mounting structure according to claim 1, wherein the first protruding electrode and the second protruding electrode comprise Au.

16. The stacked mounting structure according to claim 1, wherein an electroconductive layer is provided on a surface of an inner wall of the opening in the intermediate member.

17. The stacked mounting structure according to claim 1, the first protruding electrode and the second protruding electrode comprise a solder.

* * * * *